United States Patent [19]
Yang et al.

[11] Patent Number: 5,502,706
[45] Date of Patent: Mar. 26, 1996

[54] OPTICAL STORAGE MEDIUM UTILIZING ELECTRON TRAPPING FILM LAYERS SANDWICHED WITH ELECTRODES

[75] Inventors: Xiangyang Yang, Gaithersburg; Charles Y. Wrigley, Ijamsville; Joseph Lindmayer, Potomac, all of Md.

[73] Assignee: Quantex Corporation, Rockville, Md.

[21] Appl. No.: 271,992

[22] Filed: Jul. 8, 1994

Related U.S. Application Data

[63] Continuation-in-part of Ser. No. 207,628, Mar. 9, 1994, abandoned, which is a continuation of Ser. No. 921,008, Jul. 28, 1992, Pat. No. 5,321,270, which is a continuation of Ser. No. 721,345, Jul. 1, 1991, Pat. No. 5,134,686, which is a continuation-in-part of Ser. No. 419,479, Oct. 10, 1989, Pat. No. 5,029,253.

[51] Int. Cl.$^6$ .............................. G11C 13/00; G11B 3/70; G03C 1/00
[52] U.S. Cl. .................. 369/100; 369/288; 428/690; 428/691; 430/495.1; 430/942; 250/484.4; 365/106
[58] Field of Search ...................... 369/100, 101, 369/121, 288, 284, 291; 252/301.4 R, 301.4 S; 250/484.4, 484.1; 365/119, 110, 106; 428/690, 691; 430/495, 942

[56] References Cited

U.S. PATENT DOCUMENTS

| | | | |
|---|---|---|---|
| 4,839,092 | 6/1989 | Lindmayer | 252/301.4 S |
| 4,842,960 | 6/1989 | Lindmayer | 428/690 |
| 4,879,186 | 11/1989 | Lindmayer | 428/691 |
| 5,007,037 | 4/1991 | Lindmayer | 369/100 |
| 5,029,253 | 7/1991 | Storti et al. | 250/484.4 |
| 5,113,387 | 5/1992 | Goldsmith et al. | 369/121 |
| 5,128,849 | 7/1992 | Podraczky et al. | 369/288 |
| 5,134,686 | 7/1992 | Jutamulia et al. | 250/484.1 |
| 5,142,493 | 8/1992 | Lindmayer | 369/100 |
| 5,163,039 | 11/1992 | Lindmayer | 369/100 |
| 5,195,082 | 3/1993 | Reuay et al. | 365/110 |
| 5,319,630 | 6/1994 | Earman et al. | 369/291 |
| 5,321,270 | 6/1994 | Jutamulia et al. | 250/484.4 |

OTHER PUBLICATIONS

X. Yang et al. "Three–Dimensional Optical Memory Based On Transparent Electron Trapping Thin Films", Proc. SPIE, vol. 1773, *Photonic Neural Networks*, 1992, pp. 413–421.

X. Yang et al. "Three–dimensional Optical Memory Employing Electron Trapping Materials", Proc. SPIE, vol. 1662, *Image Storage and Retrieval Systems*, 1992, pp. 175–185.

Joseph Lindmayer, "Electronic Optical–Storage technology Approaches Development phase", Laser Focus World, Nov. 1989 pp. 119–121.

*Primary Examiner*—Georgia Y. Epps
*Assistant Examiner*—Kim-Kwok Chu
*Attorney, Agent, or Firm*—Ostrolenk, Faber, Gerb & Soffen

[57] ABSTRACT

A three-dimensional optical memory based on stacked thin film electron trapping layers. Each thin film electron trapping layer is sandwiched between pairs of insulating layers and transparent electrodes. When an electric field is applied across the electron trapping layer via the electrodes, the electron trapping process is enhanced. In this way, electrical page addressing can be achieved for writing data to the memory. The data are read out by an IR light directed into the electron trapping film from the edge, again preferably with the application of an electric field across the addressed layer to enhance readout. The application of an electric field across an addressed layer during the writing and reading steps effectively eliminates inter-page crosstalk.

16 Claims, 3 Drawing Sheets

OPTICAL STORAGE MEDIUM UTILIZING ELECTRON TRAPPING FILM LAYERS SANDWICHED WITH ELECTRODES

This invention was made with Government support under Contract F30602-91-C-0107 awarded by Rome Laboratory, Department of the Air Force, and Contract N60921-93-C-0097, awarded by the Naval Surface Warfare Center for the Ballistic Missile Defense Organization. The Government has certain rights in this invention.

RELATED APPLICATIONS

This is a continuation-in-part of U.S. application Ser. No. 08/207,628, filed Mar. 9, 1994, which is a continuation of U.S. application Ser. No. 07/921,008, abandoned Mar. 6, 1985, filed Jul. 28, 1992, now U.S. Pat. No. 5,321,270, which is a continuation of U.S. application Ser. No. 07/721,345, filed Jul. 1, 1991, now U.S. Pat. No. 5,134,686, which is a continuation-in-part of U.S. application Ser. No. 07/419,479, filed Oct. 10, 1989, now U.S. Pat. No. 5,029,253. The disclosures of all of these related applications are herein incorporated by reference.

BACKGROUND OF THE INVENTION

1. Field of the Invention

The present invention relates to a three-dimensional memory and, more specifically, to an electron trapping based three-dimensional memory without interpage crosstalk.

2. Description of the Related Art

In order to achieve higher performance, computers are increasingly relying on parallel processing and demanding memory systems with high storage capacity and fast parallel access capability. Present memory technologies such as semiconductor memories, optical disks, magnetic disks and tapes store information across a planar surface. Due to their two-dimensional nature, these storage devices are not able to provide parallel access. As the manufacturing technology matured in recent years, the storage density of these devices (e.g., optical disks) have reached the theoretical limitation, which is proportional to $1/\lambda^2$.

To overcome the restrictions imposed by present two-dimensional memory devices, three-dimensional optical memories have been proposed. Since the information is stored in volume, three-dimensional optical storage devices have higher theoretical storage capacity (proportional to $1/\lambda^3$) than the planar memories. In addition, three-dimensional optical memory devices have the potential for parallel access. The data is arranged in two-dimensional pages, or bit planes. An entire two-dimensional page can be written or read in a single memory access operation.

The performance of a two-photon based three-dimensional memory is limited by the fatigue of the materials. In order to suppress the fatigue, the two-photon materials need to be kept at low temperature (e.g., in dry ice).

Electron trapping materials do not suffer from the above-described fatigue problem associated with two-photon material. Indeed, optical memories employing electron trapping material have been demonstrated to be capable of more than one million writing, reading and erasing cycles. This longevity makes electron trapping materials an excellent media for implementing stacked layer three-dimensional optical memories. Accordingly, three-dimensional optical memories employing electron trapping materials have been proposed. See, e.g., U.S. Pat. No. 5,163,039, assigned to the same assignee as the present invention, the disclosure of which is herein incorporated by reference.

However, as described in greater detail below, the excitation by light of one layer in a multi-layered electron trapping memory in the writing process can cause inadvertent and undesired excitation of adjacent electron trapping layers. Of course, for proper operation of a multi-layer memory, it is critically important to be able to address individual memory layers and avoid interlayer "crosstalk" when writing data into the memory device. Previously, to overcome this "crosstalk" a checkerboard encoding and a differential detection scheme has been employed. See, e.g., X. Yang, C. Wrigley and J. Lindmayer, "Three-Dimensional Optical Memory Based on Transparent Electron Trapping Thin Films, Proc. SPIE, Vol. 1773, *Photonics for Computers, Neural Networks and Memories*, p. 413–422 (1992).

Although the checkerboard encoding scheme has been proven to be effective in reducing crosstalk, it is desirable to provide a system which provides a three-dimensional memory without crosstalk and which does not require special encoding and decoding schemes for proper operation.

SUMMARY OF THE INVENTION

The present invention advantageously provides a three-dimensional optical memory employing electron trapping thin film layers which is designed to avoid undesirable interlayer crosstalk, and which does not require encoding/decoding of data.

The present invention achieves this objective by providing a three-dimensional optical memory, comprising at least two thin film layers of different electron trapping material for storing and releasing information in the form of light energy, in which each of the thin film layers of electron trapping material is sandwiched between a pair of insulating layers and a pair of transparent electrodes.

The electron trapping material preferably comprises a mixture of a base material selected from the group of alkaline earth metal sulfides and mixtures thereof; a samarium dopant for establishing an electron trapping level; and a europium and/or cerium dopant for establishing an optical absorption center for writing and for providing readout luminescence. The thin film layers of different electron trapping material are deposited in a thickness on the order of microns on a substrate.

The thin film layers of electron trapping material store the information, such as digital data, in the form of an increased energy level of electrons, and release the stored information in the form of light energy of wavelengths having peaks centered about different predetermined wavelengths.

An insulating, transparent separation layer is preferably provided between adjacent transparent electrodes of neighboring thin film electron trapping layer sandwiches.

The three-dimensional optical memory of the present invention also can be provided on a transparent substrate from which information can be read and written using a system which: (i) selectively supplies voltage to the transparent electrodes to suppress the storage of information in the thin film layers of electron trapping material sandwiched therebetween; (ii) illuminates an addressed thin film layer of electron trapping material with an image comprising light energy of a first wavelength to store information in the addressed layer, while simultaneously supplying a voltage to the transparent electrodes sandwiching the addressed thin film layer to enhance the storage of information in the addressed thin film layer; (iii) illuminates the addressed thin film layer of electron trapping material with light energy of a second wavelength to release the information stored in the addressed layer, while simultaneously supplying a voltage to the transparent electrodes sandwiching the addressed thin film layer to enhance readout of information from the addressed thin film layer, the released information being emitted from the electron trapping material in the form of light energy of a third wavelength; and (iv) detects the released light energy of a third wavelength emitted by the addressed electron trapping material.

The image stored in the thin film layer of electron trapping material is preferably generated by a visible light source, a page composer and a dynamic focussing lens. An IR light source, a beam deflector and a cylindrical lens are preferably used to illuminate the thin film layer of electron trapping material with light energy of a second wavelength to release the stored image. A dynamic focussing lens and an array detector are preferably used to collect and detect the released image.

Other features and advantages of the present invention will become apparent from the following description of the invention which refers to the accompanying drawings.

BRIEF DESCRIPTION OF THE DRAWINGS

The above and other features and advantages of the present invention will become apparent when the following detailed description is read in conjunction with the accompanying drawings.

DETAILED DESCRIPTION OF THE PREFERRED EMBODIMENT

In view of the importance of electron trapping materials to the present invention, a brief review of their relevant characteristics, which are more fully described in the cited papers, is appropriate.

A. Electron Trapping Materials

Electron trapping materials characteristically can emit different output photons which correlate spatially in intensity with input photons. The preferred electron trapping material of the present invention is formed of an alkaline earth metal sulfide base doped with rare earth impurities. A number of different electron trapping materials have been developed by the assignee of the present application. For example, U.S. Pat. No. 4,839,092 discloses a material formed of a strontium sulfide base doped with samarium and europium (SrS:Sm,Eu). This material outputs orange light centered at 620 nm. Similarly, U.S. Pat. No. 4,842,960 discloses a material formed of a mixed strontium sulfide/calcium sulfide base doped with samarium and europium/cerium (SrS/CaS:Sm, Eu/Ce). This material also emits orange light, but has a very high efficiency and a brighter output than the material without calcium sulfide. The writing/storing wavelength of this preferred SrS/CaS:Sm,Eu/Ce material is about 450 nm, its stimulation wavelength is near-infrared. U.S. Pat. No. 4,879,186 discloses a material formed of a calcium sulfide base doped with samarium and europium (CaS:Sm, Eu), which outputs red light centered at 650 nm.

Each of the above electron trapping materials have electron traps with depths of about 1.0 to 1.2 electron volts. Further details of the materials and the processes for making the materials are set forth in the disclosure of each of the above-referred U.S. patents, which are herein incorporated by reference.

Figure 1:
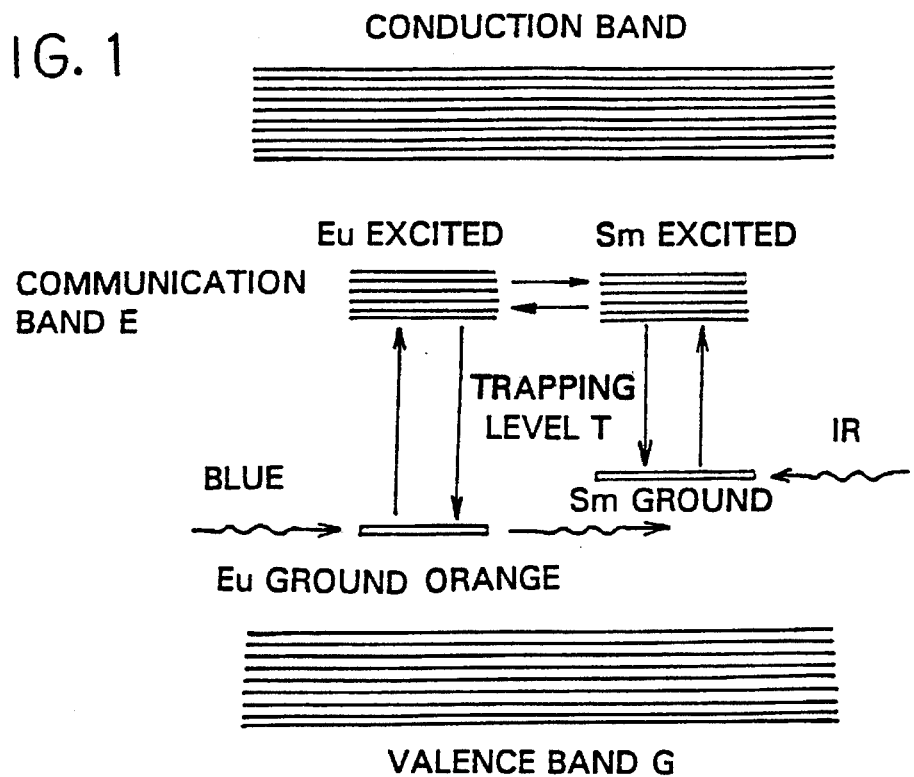
FIG. 1 shows the mechanism for light emission of electron trapping materials.

Briefly, the mechanism for light emission of electron trapping materials can be explained as follows, using the SrS:Sm,Eu material as an example, with reference to FIG. 1. Both ground and excited states of each impurity exist within the band gap of the wide-band-gap (approximately 4.4 eV) host material. Short wavelength visible light (e.g., blue light of 488 nm) excites electrons from the ground state (valence band G) to an excited state of Eu (communication band E), from whence the electrons transfer over to Sm. The electrons remain in the ground state of Sm (trapping level T) for very long times. However, subsequent exposure to IR light (e.g. 1064 nm) excites the trapped electrons to the excited states of Sm, the electrons transfer to the excited states of Eu and return to the ground state of Eu with the emission of orange/red light. By way of the above mode of operation, the electron trapping materials can be used to store optical information in the form of trapped electrons. This has been described by J. Lindmayer, P. Goldsmith and C. Wrigley in "Electronic Optical-Storage Technology Approaches Development Phase", *Laser Focus World*, p. 119, November 1989.

Advantageously, electron trapping materials exhibit a large linear dynamic range of four orders of magnitude. The response time of the emission to the IR light is on the order of tens of nanoseconds.

Disadvantageously, however, as described above, the excitation by light during the writing process of one layer in a multi-layered electron trapping memory can cause inadvertent and undesired excitation of adjacent electron trapping layers. For proper operation of a multi-layer memory, it is critically important to be able to address individual memory layers and avoid interlayer "crosstalk" when writing data into the memory device.

Figure 2:
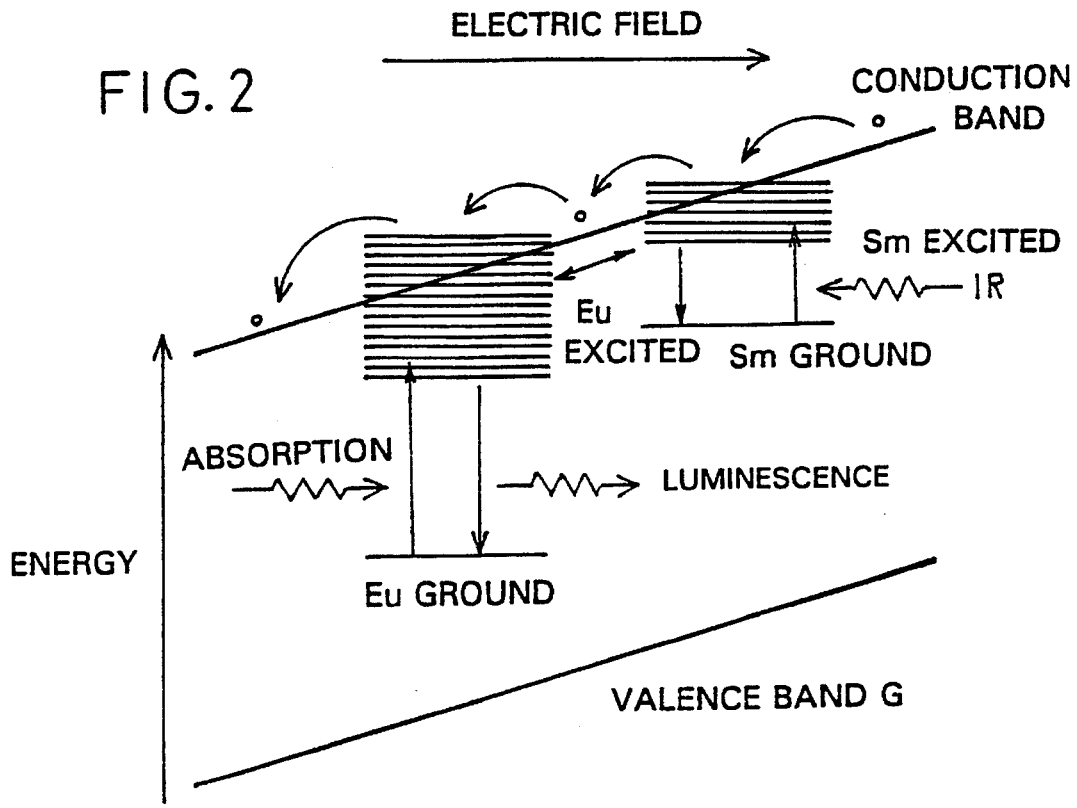
FIG. 2 shows the energy band model of electron trapping materials under an external electric field.
Figure 3:
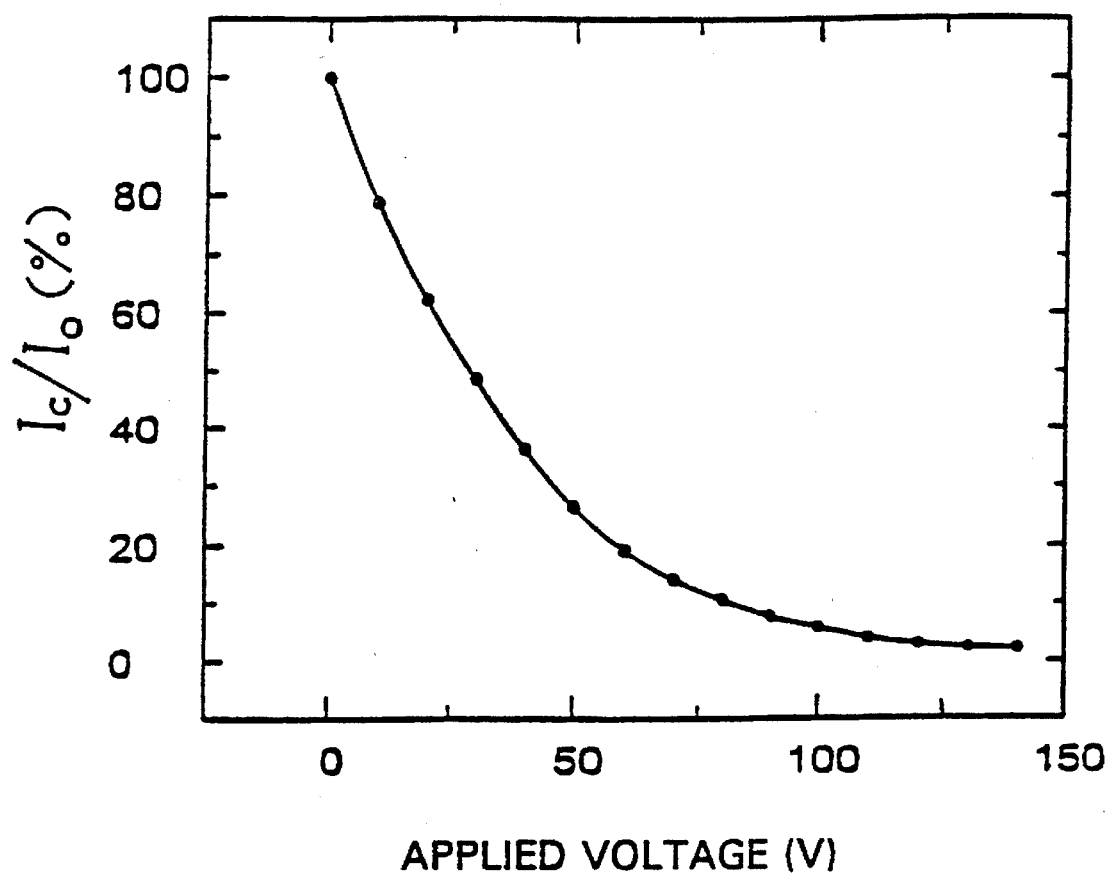
FIG. 3 is a graph showing the effect of an external electric field on the absorption fluorescence of a singly doped material with a fluorescence center similar to that of the electron trapping material.

The present inventors have designed a novel multi-layer electron trapping memory in which crosstalk is eliminated by sandwiching the electron trapping layers between transparent electrodes. When an electric field is applied across a designated electron trapping layer or layers, the electron trapping process is modified in that layer or layers by a phenomenon known as electric field induced ionization. Specifically, as shown in FIG. 2, under a sufficient external electric field, the energy band model of the electron trapping material is altered such that, instead of only tunneling to the nearby samarium atom and being trapped, the electrons excited at the Eu can tunnel to the conduction band of the host material. As shown in FIG. 3, this effect decreases the absorption fluorescence in singly doped CaS:Eu to on the order of 1% of that without the electric field.

For the doubly doped electron trapping material used in the present invention, it was initially expected that the electric field induced ionization of the (for example) Eu would result in a much reduced supply of excited electrons for the Sm to receive from the Eu and thereby reduce the resulting electron trapping. However, as shown in FIG. 2, with an applied electric field, the electrons which are caused to enter the conduction band of the host material have an easier access to the excited states of Sm atoms energetically downhill (i.e. in the opposite direction of the electric field) of each excited Eu atom than by the lateral constant-energy tunneling in the zero-field case. Consequently, the writing or electron trapping process is enhanced when an electric field is applied, due to freed (conduction band) excited electrons falling into the Sm storage sites from the host material's conduction band.

Similarly, readout of trapped electrons in the electron trapping material has been found to be enhanced by the application of an electric field across the material. In this case, stored electrons excited at Sm atoms by infrared in the plane selected for readout can enter the conduction band of the host material, cascade into downhill Eu atoms and produce readout luminescence.

The present invention takes advantage of the above-described effect of electric field ionization to eliminate crosstalk in a multi-layer electron trapping memory. Specifically, in accordance with the present invention, the concentrations of Eu and Sm disclosed in the above-referenced patents can be lowered, for example by a factor of ten, such that tunneling from Eu to Sm is made much less probable, thereby suppressing writing and readout in those layers without an applied electric field. Thus, by applying an electric field across selected layers of the multi-layer structure during the writing operation, interlayer crosstalk is advantageously eliminated in the present invention. The specific structure of the three-dimensional electron trapping memory of the present invention will now be described.

B. Three-Dimensional Optical Storage System

Figure 4:
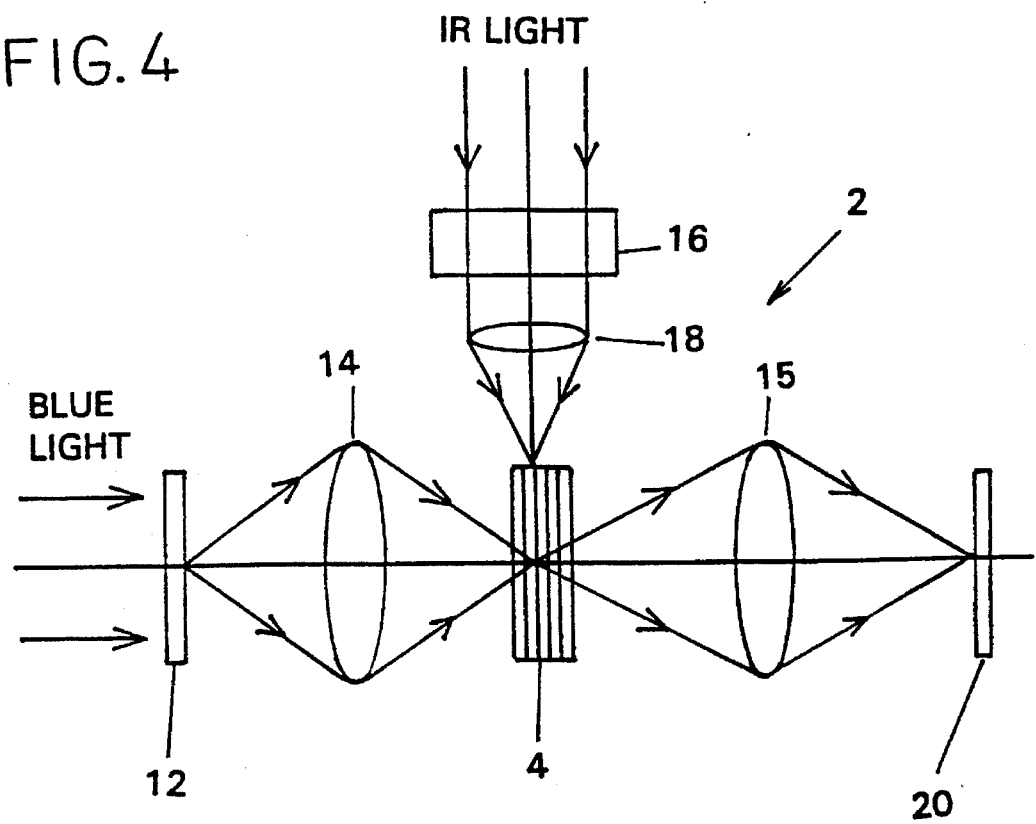
FIG. 4 shows the three-dimensional optical storage system of the present invention.
Figure 5:
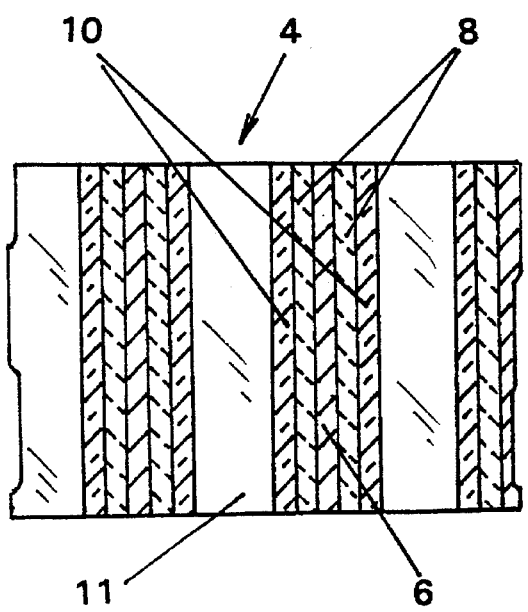
FIG. 5 shows the multilayer electron trapping device of the present invention.

The electron trapping material based three-dimensional optical storage system 2 of the present invention is schematically illustrated in FIG. 4. Analog or digital data are stored in a multilayer electron trapping device 4. As shown in FIG. 5, each electron trapping thin film 6 is sandwiched between transparent insulating layers 8 (formed, for example, of $SiO_2$, $Al_2O_3$, $Ta_2O_5$, diamond-like carbon films, or combinations thereof) and transparent electrode layers 10 (preferably formed of indium tin oxide (ITO)). Insulating layers 8 and electrode layers 10 are less than 1 μm in thickness, the thickness of the layer being controlled to achieve a maximum transmittance in accordance with the formula $$2 \cdot n \cdot h = (m + \tfrac{1}{2}) \lambda_{visible}$$

where n=refractive index h=layer thickness n=0, 1, 2, ...

such that each pair of electrode and insulating layers forms an antireflection film for blue and orange light (i.e. the charging light and the light output from the electron trapping material). An insulating, transparent separation layer 11 is provided between electrodes of neighboring electron trapping thin film sandwiches in device 4.

To write data into the memory, a page composer 12 is illuminated by a visible light beam, preferably blue light, and is imaged to the addressed electron trapping layer by a dynamic focusing lens (DFL) 14. The page addressing is achieved by applying suitable voltage to the electron trapping layer to be addressed.

To retrieve the stored data, a slice of IR light is guided into the addressed layer from the edge with a beam deflector 16 and a cylindrical lens 18, preferably again with the application of a suitable voltage to the electron trapping layer to be read. Since the refractive index of electron trapping materials (about 2.25) is higher than that of the insulating layer (e.g., 1.5 for $SiO_2$; 1.7 for $Al_2O_3$), the IR light is restricted within the addressed electron trapping film and cannot leak to the other layers. The resultant emission from the addressed electron trapping film (orange light) corresponding to the stored data is collected by a second DFL, identified in FIG. 4 as DFL 15, and detected by an array detector 20.

DFLs 14 and 15 are selected to be capable of randomly accessing any one of the page planes at very high speed to ensure a high data transfer rate. Each bit in the page composer is imaged onto electron trapping thin film and then imaged exactly onto the corresponding pixel of the detector array. The data pages are preferably binary patterns or analog images with very high resolution and large space-bandwidth product to assure large capacity and high storage density.

In summary, the present invention provides a three-dimensional optical storage system based on transparent electron trapping thin films. It extends storage into the third dimension, enabling higher capacity and faster access time than existing two-dimensional memories. Since the two-dimensional data pages are stored and retrieved in parallel, the achievable data transfer rate is substantially increased over prior art memories. Thus, the three-dimensional optical storage system of the present invention can be utilized as high speed, high density, massive memory for supercomputers. In addition, its parallel access nature makes it compatible with the next generation of ultrafast parallel opto-electronic computers which combine optical interconnects with electronic processing. The crosstalk in electron trapping material based three-dimensional optical memory is advantageously overcome by the effect of electric field induced ionization.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A three-dimensional optical memory, comprising:

at least two thin film layers of electron trapping material for storing and releasing information in the form of excited electrons trapped at, and released from, an electron trapping level;

wherein each of said thin film layers of electron trapping material is sandwiched between a pair of insulating layers and a pair of transparent electrodes.

2. The three-dimensional optical memory of claim 1, wherein said electron trapping material comprises a mixture of:

a base material selected from the group of alkaline earth metal sulfides and mixtures thereof;

a samarium dopant for establishing said electron trapping level; and a europium and/or cerium dopant for establishing a site for visible light absorption and luminescence;

said thin film layers of different electron trapping material being deposited in a thickness on the order of a micron on a substrate.

3. The three-dimensional optical memory of claim 1, wherein said stored information comprises analog data.

4. The three-dimensional optical memory of claim 1, wherein the release of the excited electrons from the electron trapping level in said thin film layers of electron trapping material results in the release of the stored information in the form of light energy of wavelengths having peaks centered about different predetermined wavelengths.

5. The three-dimensional optical memory of claim 1, further comprising a separation layer between adjacent transparent electrodes of neighboring thin film electron trapping layer sandwiches.

6. The three-dimensional optical memory of claim 1, wherein said stored information comprises digital data.

7. A three-dimensional optical memory system, comprising:
   (a) an optical memory comprising a substrate coated with at least two thin film layers of different electron trapping material for storing and releasing information in the form of excited electrons trapped at, and released from, an electron trapping energy level, each of said thin film layers of electron trapping material being sandwiched between a pair of insulating layers and a pair of transparent electrodes;
   (b) means for selectively supplying voltage to said transparent electrodes simultaneously with the storage and retrieval of information from said thin film layers of electron trapping material sandwiched therebetween;
   (c) means for illuminating an addressed thin film layer of electron trapping material with light energy of a first wavelength to excite electrons in the material to the electron trapping level and thereby store the information in the addressed layer, while simultaneously supplying a voltage to the transparent electrodes sandwiching the thin film layer;
   (d) means for illuminating the addressed thin film layer of electron trapping material with light energy of a second wavelength to release the excited electrons in the material from the electron trapping level and thereby release the information stored in said addressed layer in the form of light energy of a third wavelength; and
   (e) means for detecting the released light energy of a third wavelength emitted by said addressed electron trapping material.

8. The three-dimensional optical memory system of claim 7, wherein said means for illuminating the addressed thin film layer of electron trapping material with light energy of a second wavelength to release the information stored in said addressed layer comprises an IR light source, a beam deflector and a cylindrical lens.

9. The three-dimensional optical memory system of claim 7, wherein said means for illuminating the addressed thin film layer of electron trapping material with light energy of a second wavelength includes means for simultaneously supplying a voltage to the transparent electrodes sandwiching the addressed thin film layer.

10. The three-dimensional optical memory system of claim 7, wherein said light energy of a first wavelength comprises visible light, and said means for illuminating an addressed thin film layer of electron trapping material with light energy of a first wavelength comprises a visible light source, a page composer and a dynamic focussing lens.

11. The three-dimensional optical memory system of claim 7, wherein said means for detecting the released light comprises a dynamic focussing lens and an array detector.

12. A method of storing information in an optical memory, comprising the steps of:
   (a) providing a substrate with at least two thin film layers of electron trapping material which store and release information in the form of excited electrons trapped at, and released from, an electron trapping level, said thin film layers of electron trapping material each being sandwiched between a pair of transparent electrodes;
   (b) illuminating an addressed thin film layer of electron trapping material with light energy of a first wavelength to excite electrons in the material to the electron trapping level and thereby store the information in the addressed layer, while simultaneously supplying a voltage to the transparent electrodes sandwiching said addressed thin film layer;
   (d) illuminating said addressed thin film layer of electron trapping material with light energy of a second wavelength to release the excited electrons in the material from the electron trapping level and thereby release the information stored in said addressed layer in the form of light energy of a third wavelength; and
   (e) detecting the released light energy of a third wavelength emitted by the addressed electron trapping material.

13. The method of storing information in an optical memory as recited in claim 12, wherein said stored information comprises analog data.

14. The method of storing information in an optical memory as recited in claim 12, further comprising the step of simultaneously supplying a voltage to the transparent electrodes sandwiching said addressed thin film layer during the step of illuminating said addressed thin film layer of electron trapping material with light energy of a second wavelength.

15. The method of storing information in an optical memory as recited in claim 12, wherein said stored information comprises digital data.

16. The method of storing information in an optical memory as recited in claim 12, wherein the release of the excited electrons from the electron trapping level in said addressed thin film layer of electron trapping material results in the release of the stored information in the form of light energy of a wavelength having peaks centered about different predetermined wavelengths.

* * * * *